(12) United States Patent  (10) Patent No.: US 8,042,261 B2
Su  (45) Date of Patent: Oct. 25, 2011

(54) METHOD FOR FABRICATING EMBEDDED THIN FILM RESISTORS OF PRINTED CIRCUIT BOARD

(76) Inventor: Sung-Ling Su, Taipei (TW)

( * ) Notice: Subject to any disclaimer, the term of this patent is extended or adjusted under 35 U.S.C. 154(b) by 447 days.

(21) Appl. No.: 12/356,083

(22) Filed: Jan. 20, 2009

(65) Prior Publication Data

US 2010/0181207 A1    Jul. 22, 2010

(51) Int. Cl.
*H01C 17/06*    (2006.01)
(52) U.S. Cl. ............ 29/620; 29/610.1; 29/829; 29/844; 438/112; 438/126; 438/382; 438/754; 438/778
(58) Field of Classification Search .................... 29/620, 29/610.1, 619, 621, 829, 832, 844; 438/112, 438/126, 382, 754, 778
See application file for complete search history.

(56) References Cited

U.S. PATENT DOCUMENTS 6,281,090 B1 * 8/2001 Kukanskis et al. ........... 438/382
7,213,327 B2 * 5/2007 Su et al. ........................ 29/610.1

* cited by examiner

*Primary Examiner* — Thiem Phan

(57) ABSTRACT

A method for fabricating the embedded thin film resistors of a printed circuit board is provided. The embedded thin film resistors are formed using a resistor layer built in the printed circuit board. In comparison with conventional discrete resistors, embedded thin film resistors contribute to a smaller printed circuit board as the space for installing conventional resistors is saved, and better signal transmission speed and quality as the parasitic capacitive reactance effect caused by two contact ends of the conventional resistors is also avoided. The method for fabricating the embedded thin film resistors provided by the invention can be conducted using the process and equipment for conventional printed circuit boards and thereby saving the investment on new types of equipment. The method can be applied in the mass production of printed circuit boards and thereby reduce the manufacturing cost significantly.

5 Claims, 9 Drawing Sheets

METHOD FOR FABRICATING EMBEDDED THIN FILM RESISTORS OF PRINTED CIRCUIT BOARD

BACKGROUND OF THE INVENTION

1. Field of the Invention

The present invention generally relates to a method for fabricating embedded thin film resistors of a printed circuit board, and more specifically to a method of fabricating one or more embedded resistors in a printed circuit board.

2. The Prior Arts

In general, besides using conventional discrete passive elements, a printed circuit board can also use a thick film or a thin film process to develop the embedded resistors required. In the thick film process, the resistors of the printed circuit board are made of carbon paste printed on the printed circuit board. Then the resistances of the resistors are fine-tuned by the laser trimming after drying. In the thin film process, on the other hand, a nickel-silicide-plated copper foil is used to replace the pure copper foil. The nickel-silicide-plated copper foil and the epoxy resin of the printed circuit board are pressed together during the fabricating process of the printed circuit board. The nickel-silicide-plated side of the copper foil faces toward the laminate of the printed circuit board and the non-plated side of the copper foil faces outward. Then, in a subsequent photolithography process, an acid etching solution is first used to etch both the copper and nickel-silicide layers, and then an alkaline etching solution is used to etch away the copper layer above the embedded resistors. One or more nickel-silicide blocks with the required dimensions are thereby formed. Laser is then used to trim each of the nickel-silicide blocks to achieve the precise resistance required.

In addition, U.S. company, Macdermid, developed a process to fabricate embedded resistors by adopting the nickel-phosphorus or palladium-phosphorus deposition technology conventionally used in industry. The process includes circuitry fabrication, activation, forming photosensitive etching resist, lithographic etching to expose resistor locations, immersing in an electroless dip solution, removing photosensitive etching resist, and fine-tuning resistance with laser trimming to accomplish the fabrication of embedded thin film resistors.

SUMMARY OF THE INVENTION

In aforementioned conventional thick film resistor fabricating methods, using high curing temperature carbon paste for the resistors is rather simple, and the technology is mature and less costly. However, because the laminate of the printed circuit board is susceptible to high temperature, only a low curing temperature carbon paste can be used. The macromolecular polymer contained in the low curing temperature carbon paste will remain in the formed resistors even after the curing and solidification processes of the resistors. The hydrophilic property of the macromolecular polymer is the major factor causing the resistances of the resistors to vary along with the environmental change. Therefore, resistors having constant and precise resistances are difficult to achieve. On the other hand, the technology for embedded resistors using nickel-silicide-plated copper foil use the same technological process as the conventional printed circuit board fabrication methods. The fabricated embedded resistors also have better stability and accuracy than those made by thick film methods. However, because the nickel-silicide-plated copper foil is difficult to manufacture, there are only limited supply sources and therefore the price is high. As the activation technology of the method using the electroless deposition technology developed by Macdermid uses Palladium or other precise metal, and the current industrial activation technology is immersion, the immersion of the entire printed circuit board in the Palladium solution is very costly and considered as a waste. Furthermore, the thickness of the activation layer is deposited to only the micro meter scale. When pressing the photosensitive etching resist, the activation layer will be attached to the etching resist film, which will be washed away in the subsequent photolithography step. Also, the alkaline solution for photolithography will dissolve some part of the activation layer, which leads to the damage of the activation function and reduces the reliability of the embedded resistors. This may be the reason that the method is not widely accepted by the market since the publication of the method in 2001. While the present invention is similar to the method for fabrication embedded thin film resistors of printed circuit board developed by Macdermid, the present invention overcomes the interferences to the sensitization caused by attaching the photosensitive etching resist and photolithography technique. To overcomes the aforementioned interferences, the present invention changes the activation technique into the sensitization step and the activation step, as well as move the attachment of the photosensitive etching resist and photolithography steps after the steps of sensitization and activation. By increasing the density of the sensitization solution, the aforementioned interferences to the sensitization caused by attaching the photosensitive etching resist and photolithography technique can be overcome. Furthermore, the sensitization solution, such as stannous chloride, is inexpensive; therefore, the cost increase incurred by increasing the density is limited. Because the Palladium-based activation solution is expensive, the present invention is cost effective by arranging the activation step after the photolithography step so as to ensure the activation function of the Palladium as well as only depositing the expensive Palladium on the embedded resistors.

The present invention provides a method for fabricating embedded thin film resistors of printed circuit boards to overcome the problems and the disadvantages of one or more conventional methods.

The method for fabricating embedded thin film resistors of printed circuit boards and the printed circuit board structure achieved disclosed in the following are only for illustrating purpose. The method provided by the present invention can be applied to single-sided, double-sided, multi-layered, and build-up printed circuit boards to fabricate the embedded resistors required by the circuitry design through the use of electroless dip technique.

In comparison with the conventional methods, the present invention of a method for fabricating embedded thin film resistors of printed circuit boards has the following advantages:

1. The embedded thin film resistors made by the present invention are embedded within the printed circuit board to replace the bulky conventional discrete resistors. The printed circuit board can therefore have finer circuit layout and much smaller size.
2. The embedded thin film resistors made by the present invention are embedded within the printed circuit board to reduce, or even eliminate, the parasitic capacitive reactance effect usually found at the connectors of conventional discrete resistors. The signal transmission speed and quality of the printed circuit board is therefore significantly enhanced, especially for high frequency applications.

3. The process for forming the resistor layer provided by the present invention is very similar to that used for ordinary printed circuit boards and can be carried out using the same equipment. Therefore there is no significant investment on new equipment. The process for forming the resistor layer provided by the present invention, just like the process for ordinary printed circuit boards, is applicable in mass production and contributes to a significant lower manufacturing cost.

The foregoing and other objects, features, aspects and advantages of the present invention will become better understood from a careful reading of a detailed description provided herein below with appropriate reference to the accompanying drawings.

DETAILED DESCRIPTION OF THE PREFERRED EMBODIMENTS

Figure 1:
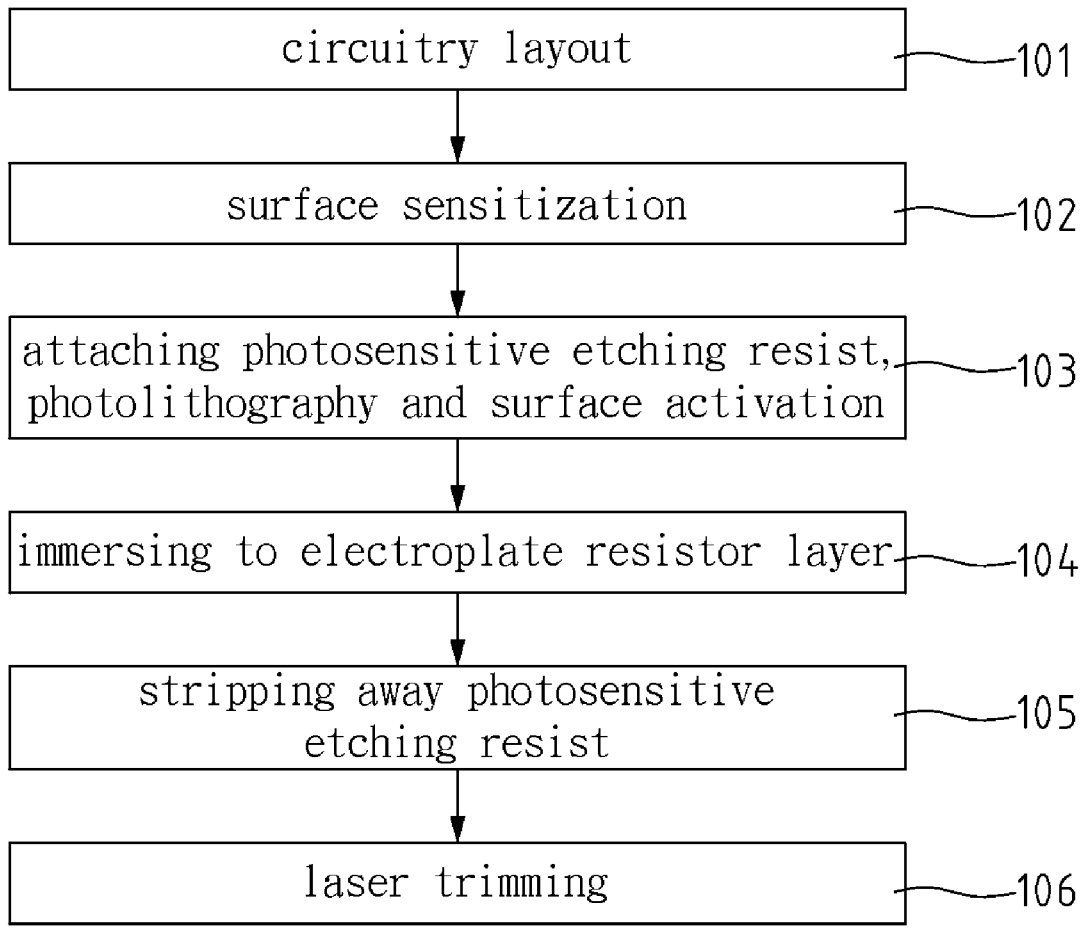
FIG. 1 is a flow chart showing the steps of forming embedded thin film resistors on a printed circuit board according to a first embodiment of the present invention.

FIG. 1 is a flow chart showing the steps of forming embedded thin film resistors on a printed circuit board according to a first embodiment of the present invention. These steps are described sequentially as follows.

Figure 2A:
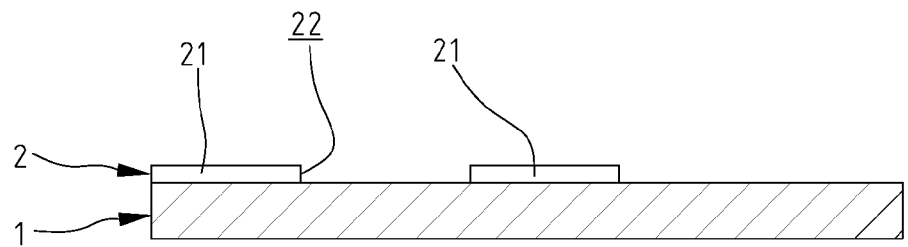
FIGS. 2(a)-2(e) are schematic diagrams showing the various steps of FIG. 1 respectively.

In step 101, as shown in FIG. 2(a), a conductive circuitry (21) is formed on the copper foil layer (2), which is on the surface of the laminate (1) made of an insulating material, and the circuitry (21) also includes one or more corresponding resistor windows (22) according to the locations and the sizes of resistors required by said circuitry (21).

The foregoing conductive circuitry (21) and resistor windows (22) on the copper foil (2) can be formed using the electroplating, image transfer and etching techniques of an ordinary printed circuit board fabrication process such as the conventional subtractive, additive, or semi-additive process.

Figure 2B:
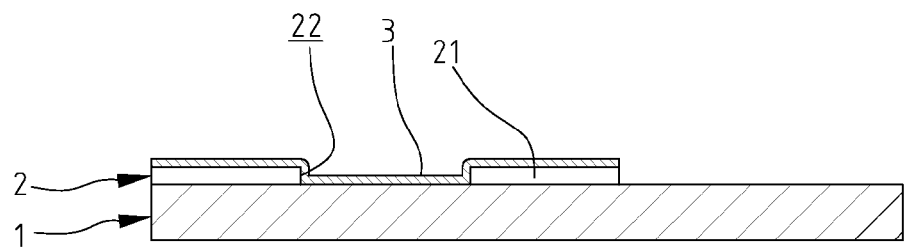

In step 102, as shown in FIG. 2(b), a sensitized layer (3) is coated on the printed circuit board of step 101, where the sensitized layer (3) has a strong reduction capability. The most common sensitization solution is stannous chloride. The sensitized layer (3) must be coated to the thickness to retain the sensitization capability after the subsequent attaching of photosensitive etching resist and photolithography steps.

Figure 2C:
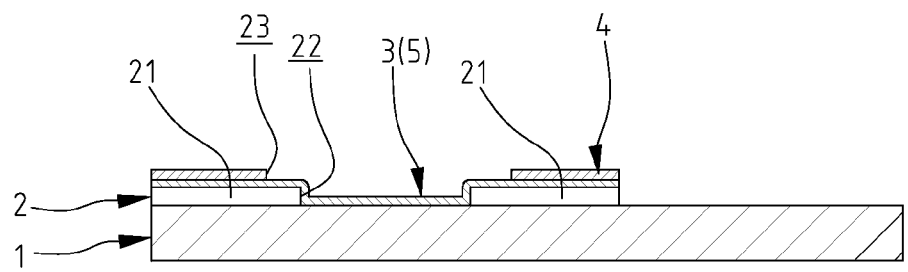

In step 103, as shown in FIG. 2(c), a photosensitive etching resist layer (4) is painted or attached to the surface of the sensitized copper foil layer (2), and the photolithography technique is used to expose each resistor frame (23). The resistor frames (23) expose the sensitized layer (3) on top of the copper foil layer (2). Then, the activation technique is performed on the printed circuit board. The activation solution will only reduce the surface of the resistor frames (23) covered with sensitized layer (3) to the activated layer (5). The length of resistor frames (23) is the same as or slightly longer than the resistor windows (22) in the circuitry (21) direction to ensure the good contact condition of the contact endpoints.

Figure 2D:
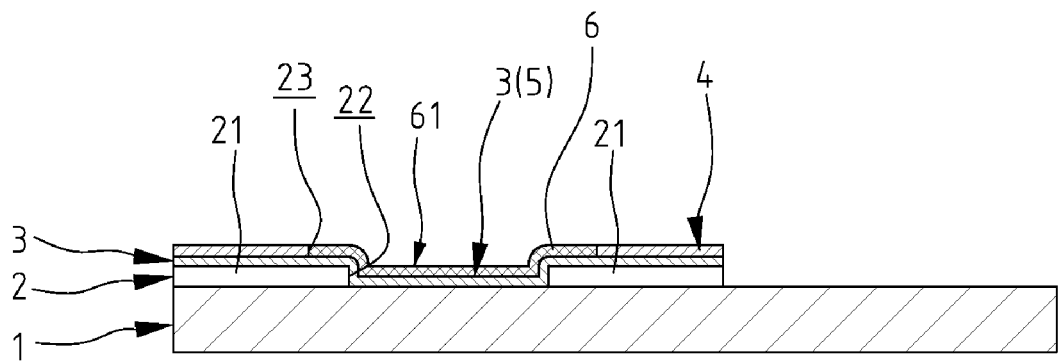

In step 104, as shown in FIG. 2(d), the printed circuit board is immersed in an electroless dip solution. The electroless dip solution only coats a resistor layer (6) on the activation layer (5) inside the resistor frames (23), until the thickness of the resistor layer (6) to a pre-defined thickness. The deposited resistor layer (6) forms the resistor elements (61).

The aforementioned electroless dip solution for the resistor layer (6) can be nickel-phosphorus or palladium-phosphorus dip solution or other electroless dip solutions with resistance.

Figure 2E:
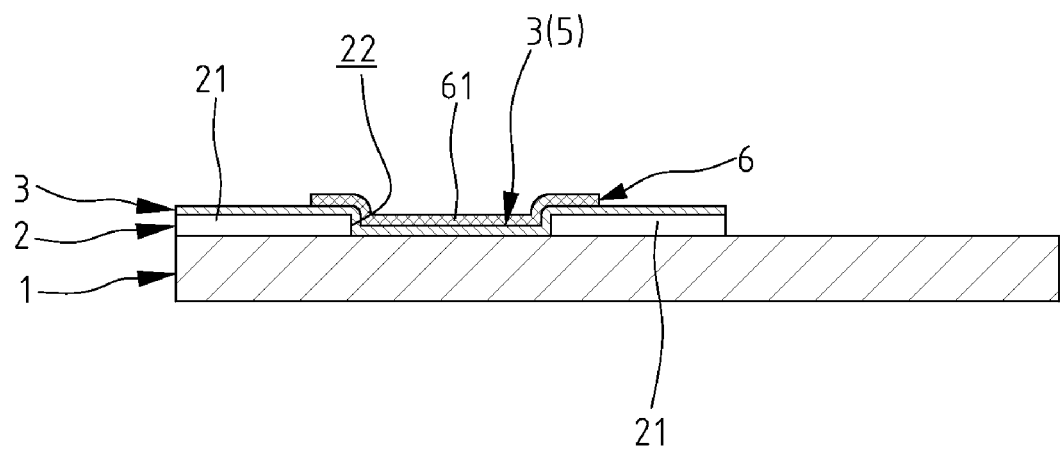

In step 105, as shown in FIG. 2(e), the photosensitive etching resist layer (4) on the copper foil layer (2) is stripped away.

In Step 106, a laser trimming technique is used to perform precise trimming on the resistor layer (6) so as to fine-tuning the locations, sizes, and resistances of resistor elements (61). The resistor layer (6), after the trimming, forms the resistor elements (61).

In the foregoing step of laser trimming, each resistor element (61) of the resistor layer (6) can be coated with a protective layer of ink. The protective ink is then heated and solidified so that subsequent fabrication steps of the printed circuit board will not affect the resistance of each resistor element (61). The coating and solidification of the protective ink layer can also be conducted before the laser trimming. In this way, undesirable influence of the ink coating and solidification on the resistances of the resistor elements (61) can be avoided after their resistances are adjusted by laser trimming.

Figure 3:
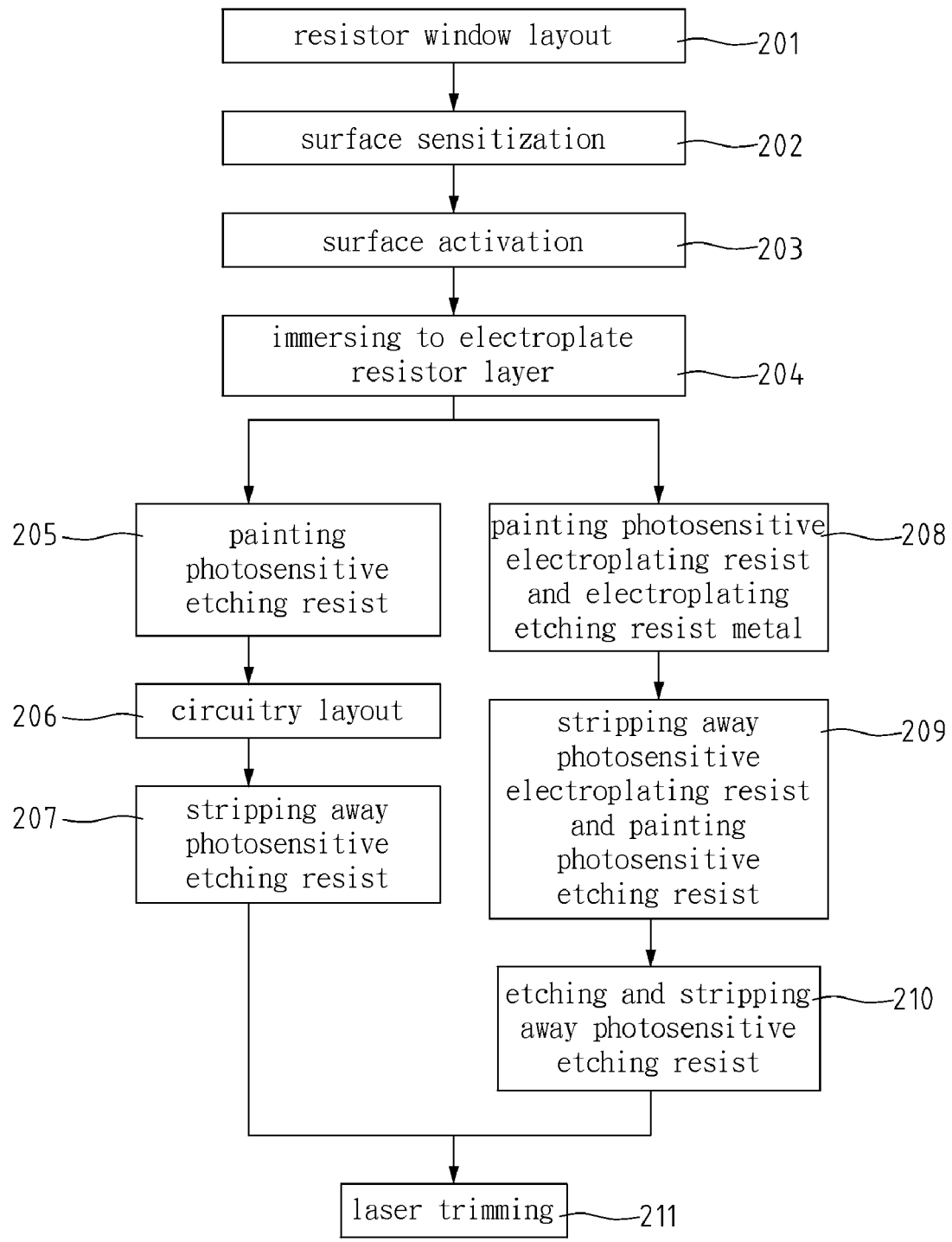
FIG. 3 is a flow chart showing the steps of forming embedded thin film resistors on a printed circuit board according to a second embodiment of the present invention.

FIG. 3 is a flow chart showing the steps of forming embedded thin film resistors on a printed circuit board according to a second embodiment of the present invention. These steps are described sequentially as follows.

Figure 4A:
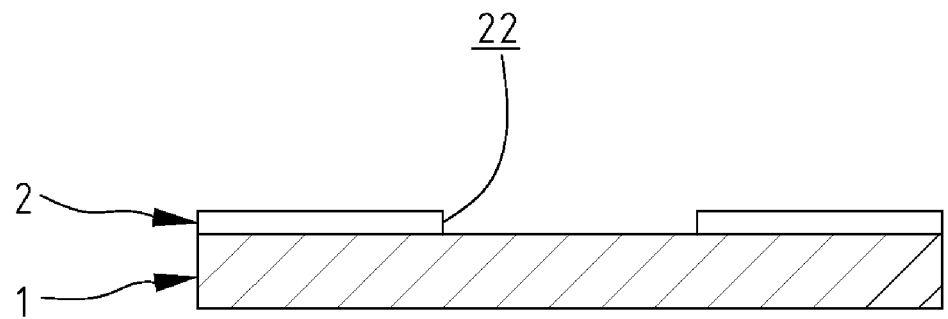
FIGS. 4(a)-4(j) are schematic diagrams showing the various steps of FIG. 3 respectively.

In step 201, as shown in FIG. 4(a), a photosensitive etching resist layer (4) is painted or attached on the copper foil layer (2), which is on the surface of the laminate (1) made of an insulating material. The photosensitive etching resist layer (4) is then etched with a photolithography technique to form one or more resistor windows (22) according to the locations and the sizes of the resistors required in a circuitry. The photosensitive etching resist layer (4) is then stripped away.

Figure 4B:
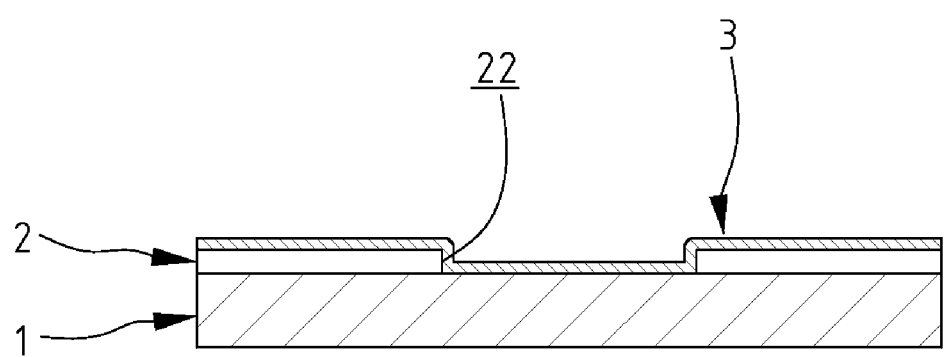

In step 202, as shown in FIG. 4(b), a sensitization solution is used to coat a sensitized layer on the surface of the resistor windows (22) to sensitize chemical polymer insulation interface exposed by the resistor windows (22) on the laminate (1), where the sensitized layer (3) has a strong reduction capability. The most common sensitization solution is stannous chloride. The sensitized layer (3) must be coated to the thickness to retain the sensitization capability after the subsequent attaching of photosensitive etching resist and photolithography steps.

Figure 4C:
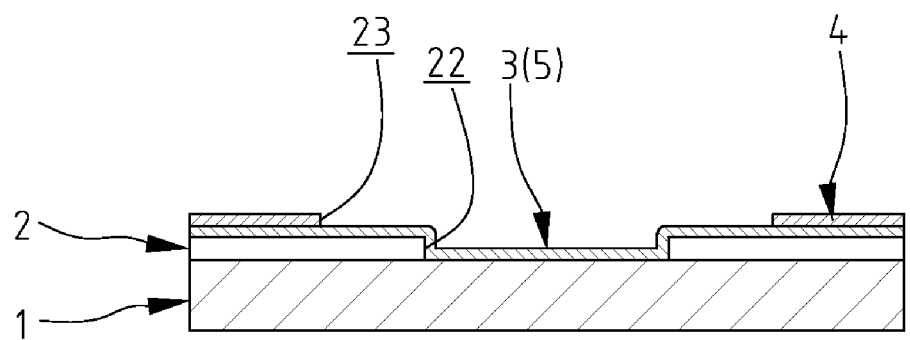

In step 203, as shown in FIG. 4(c), a photosensitive etching resist layer (4) is painted or attached and the photolithography technique is then to expose each resistor frame (23). The length of resistor frames (23) is the same as or slightly longer than the resistor windows (22) in the circuitry (21) direction to ensure the good contact condition of the contact endpoints. The activation step is then performed on the printed circuit board. The activation solution only reduces the surface of the resistor frames (23) covered with sensitized layer (3) to the activated layer (5).

Figure 4D:
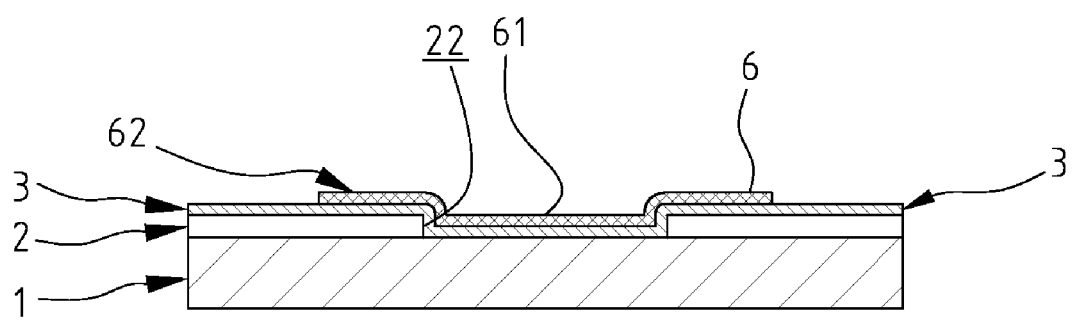

In step 204, as shown in FIG. 4(d), the printed circuit board is immersed in an electroless dip solution to coat a resistor layer (6) on the activation layer (5) inside the resistor frames (23), until the thickness of the resistor layer (6) to a pre-defined thickness. The deposited resistor layer (6) forms the resistor elements (61), with the two contact endpoints (62). Then, the photosensitive etching resist layer (4) is stripped away.

The aforementioned electroless dip solution for the resistor layer (6) can be nickel-phosphorus or palladium-phosphorus dip solution or other electroless dip solutions with resistance.

Figure 4E:
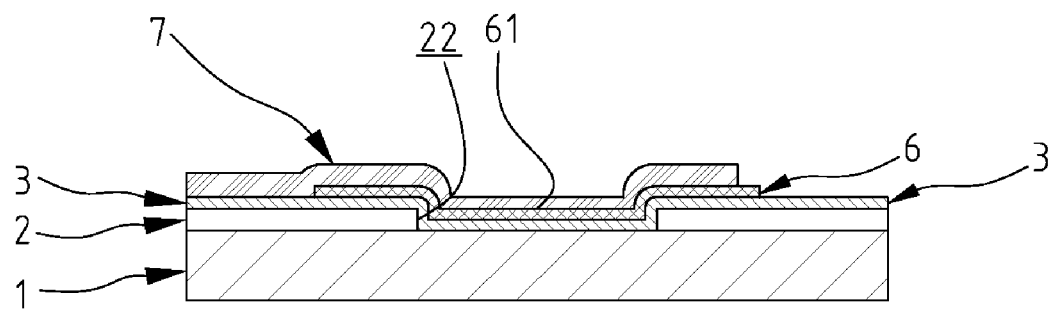

In step 205, as shown in FIG. 4(e), with the photosensitive etching resist layer painting or attaching technique and the photolithography technique, an etching resist thin film (7) with a pattern of a circuitry (21) and resistor elements (61) is formed on the copper foil layer (2) and the resistor layer (6) according to the required circuitry.

Figure 4F:
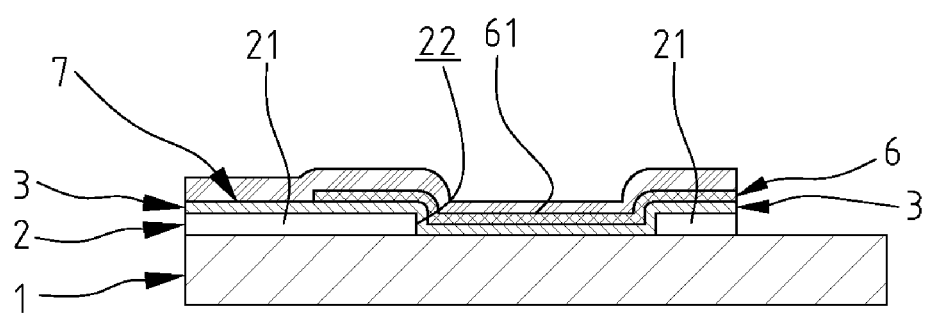

In step 206, as shown in FIG. 4(f), an etching technique is applied to etch the copper foil layer (2) so that the copper foil layer (2) forms the circuitry (21) corresponding to the pattern of the etching resist thin film (7).

Figure 4G:
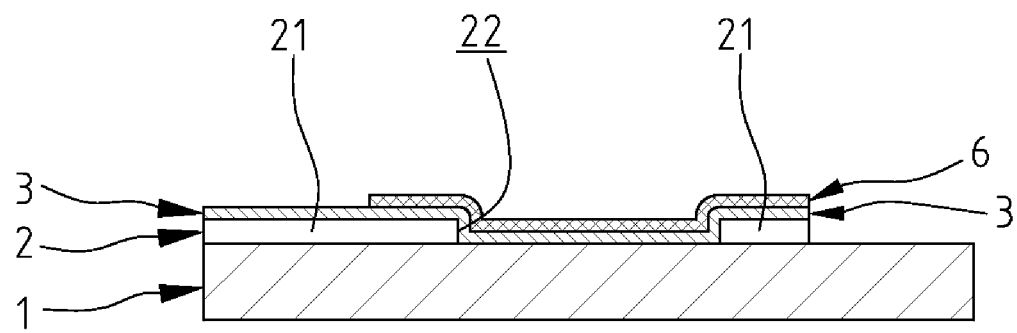

In step 207, as shown in FIG. 4(g), the etching resist thin film (7) on the copper foil layer (2) is stripped away.

Step 205 to step 207 are the steps of positive film etching technique.

On the other hand, if a negative film electroplating etching technique, the following steps (starting right after FIG. 4(d)) can accomplish the fabrication of the circuitry and the embedded resistors.

Figure 4H:
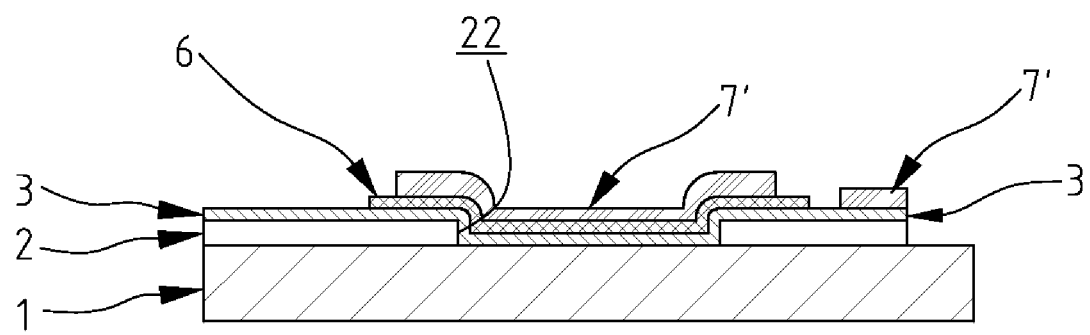

Following step 204 (FIG. 4(d)), in step 208, as shown in FIG. 4(h), with the photosensitive etching resist layer painting or attaching technique and the photolithography technique, an electroplating resist thin film (7') with a pattern of a circuitry (21) and resistor elements (61) is formed on the copper foil layer (2) and the resistor layer (6) according to the required circuitry.

Figure 4I:
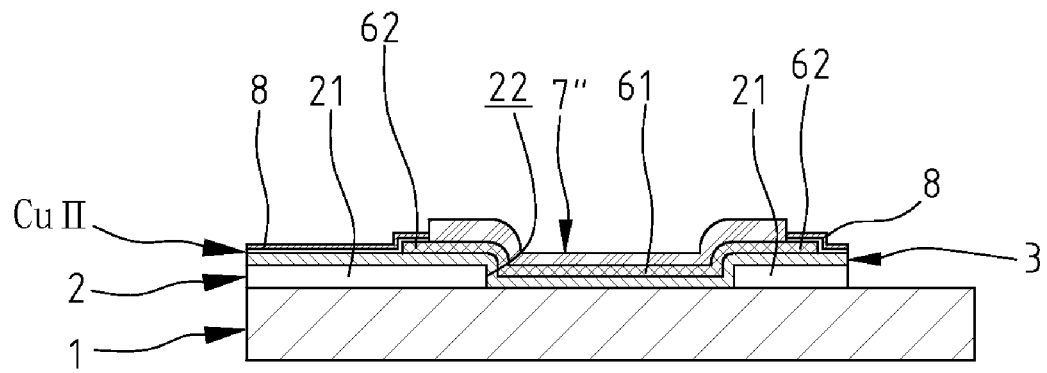

In step 209, as shown in FIG. 4(i), a layer of copper (Cu II) and etching resist metal (8), such as, tin or tin-lead, is electroplated to a pre-defined thickness. The electroplating resist thin film (7') is then stripped away. The photosensitive etching resist layer painting or attaching technique and the photolithography technique are used to form an etching resist thin film (7") on the resistor elements (61), and then the etching is performed.

Figure 4J:
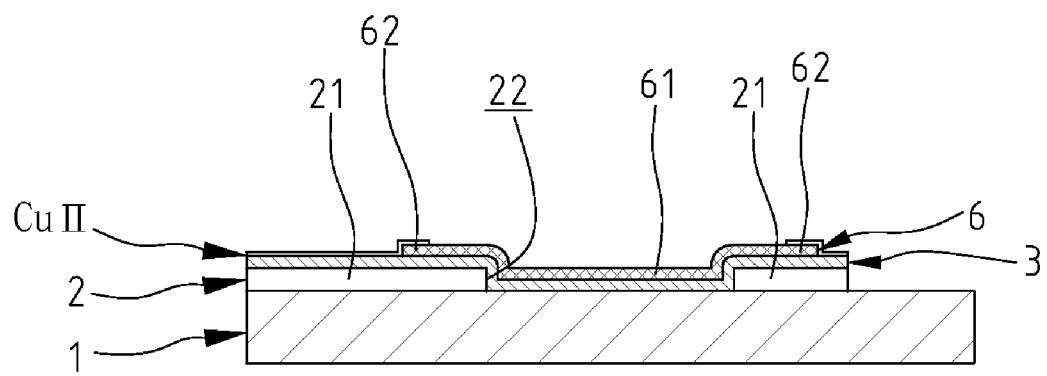

In step 210, as shown in FIG. 4(j), the etching resist metal layer (8) on the circuitry (21) and the etching resist thin film (7") on the resistor elements (61) are stripped away.

Step 208 to step 210 are the steps of negative film electroplating etching technique.

In step 211, a laser trimming technique is used to perform precise trimming on the resistor layer (6) so as to fine-tuning the locations, sizes, and resistances of resistor elements (61). The resistor layer (6), after the trimming, forms the resistor elements (61).

In the foregoing step of laser trimming, each resistor element (61) of the resistor layer (6) can be coated with a protective layer of ink. The protective ink is then heated and solidified so that subsequent fabrication steps of the printed circuit board will not affect the resistance of each resistor element (61). The coating and solidification of the protective ink layer can also be conducted before the laser trimming. In this way, undesirable influence of the ink coating and solidification on the resistances of the resistor elements (61) can be avoided after their resistances are adjusted by laser trimming.

As shown in FIG. 2(e) and FIG. 4(j), the printed circuit board manufactured by the aforementioned fabrication process will include a laminate (1), a copper foil layer (2) formed on top of the laminate (1), and then a resistor layer (6) on top of copper foil layer (2). The resistor layer (6) includes a plurality of resistor elements (61), and each resistor element (61) can be of a specific resistance according to the requirement of the circuit design on the printed circuit board. Each aforementioned resistor element (61) has two contact endpoints (62), with each contact endpoint (62) forming electrical connection with the corresponding circuitry (21) of the copper foil layer (2).

Although the present invention has been described with reference to the preferred embodiments, it will be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A method for fabricating embedded thin film resistors of a printed circuit board, comprising the steps of:
    (a) forming a circuitry required by a printed circuit board on a copper foil layer formed on the surface of a laminate made of an insulating material, and forming one or more corresponding resistor windows according to the locations and the sizes of resistors required by said circuitry;
    (b) coating a sensitized layer on said printed circuit board of step (a);
    (c) painting or attaching a photosensitive etching resist layer to the surface of said sensitized copper foil layer, and applying a photolithography technique to expose each resistor frame, said resistor frames exposing said sensitized layer on top of said copper foil layer; performing an activation technique using activation solution on said printed circuit board, said activation solution only reducing the surface of said resistor frames covered with said sensitized layer to an activated layer, the length of said resistor frames being the same as or slightly longer than said resistor windows in said circuitry direction to ensure the good contact condition of the contact endpoints;
    (d) immersing said printed circuit board in an electroless dip solution, said electroless dip solution only coating a resistor layer on said activation layer inside said resistor frames, depositing until the thickness of said resistor layer to a pre-defined thickness, said deposited resistor layer forming required resistor elements; and
    (e) stripping away said photosensitive etching resist layer on said copper foil layer.

2. The method for fabricating embedded thin film resistors of a printed circuit board according to claim 1, wherein said sensitized layer has a strong reduction capability, stannous chloride can be used as sensitization solution, and said sensitized layer must be coated to the thickness to retain the sensitization capability after subsequent attaching of photosensitive etching resist and photolithography steps.

3. The method for fabricating embedded thin film resistors of a printed circuit board according to claim 1, wherein said resistor layer is made of an electroless dip solution selected from the group consisting of nickel-phosphorus, palladium-phosphorus, and other electroless dip solutions with resistance.

4. The method for fabricating embedded thin film resistors of a printed circuit board according to claim 1, further comprising a final step of using a laser trimming technique to perform precise trimming on said resistor elements on said resistor layer so as to fine-tuning the locations, sizes, and resistances of said resistor elements.

5. The method for fabricating embedded thin film resistors of a printed circuit board according to claim 4, wherein in foregoing step of laser trimming, each said resistor element on said resistor layer can be coated with a protective layer of ink, said protective ink is then heated and solidified; alternatively, the coating and solidification of said protective ink layer can also be conducted before said laser trimming step so as to avoid undesirable influence of ink coating and solidification on the resistances of said resistor elements after adjusted by laser trimming.

* * * * *